United States Patent [19]

Welch

[11] Patent Number: 6,091,128

[45] Date of Patent: Jul. 18, 2000

[54] SEMICONDUCTOR SYSTEMS UTILIZING MATERIALS THAT FORM RECTIFYING JUNCTIONS IN BOTH N AND P-TYPE DOPING REGIONS, WHETHER METALLURGICALLY OR FIELD INDUCED, AND METHODS OF USE

[76] Inventor: James D. Welch, 10328 Pinehurst Ave., Omaha, Nebr. 68124

[21] Appl. No.: 09/033,695

[22] Filed: Mar. 3, 1998

Related U.S. Application Data

[63] Continuation-in-part of application No. 08/250,906, May 31, 1994, abandoned, which is a continuation-in-part of application No. 08/368,149, Dec. 29, 1994, Pat. No. 5,663,584, which is a continuation-in-part of application No. 08/578,336, Dec. 26, 1995, Pat. No. 5,760,449.

[60] Provisional application No. 60/059,270, Sep. 18, 1997.

[51] Int. Cl.[7] ......................... H01L 27/095; H01L 29/47
[52] U.S. Cl. ............................................ 257/476; 257/471
[58] Field of Search .................................. 257/476, 471, 257/477, 483, 484, 369, 401, 382, 383, 384

[56] References Cited

U.S. PATENT DOCUMENTS

| | | | |
|---|---|---|---|
| 4,300,152 | 11/1981 | Lepselter | 357/42 |
| 4,485,550 | 12/1984 | Koeneke et al. | 29/571 |
| 4,696,093 | 9/1987 | Welch | 437/176 |
| 5,049,953 | 9/1991 | Mihara et al. | 357/15 |
| 5,177,568 | 1/1993 | Homna et al. | 257/295 |
| 5,229,323 | 7/1993 | Shimada et al. | 437/176 |
| 5,250,834 | 10/1993 | Nowak | 257/471 |
| 5,663,584 | 9/1997 | Welch | 257/288 |
| 5,760,449 | 6/1998 | Welch | 257/471 |

FOREIGN PATENT DOCUMENTS

| | | | |
|---|---|---|---|
| 4-56360 | 2/1992 | Japan | 257/471 |

OTHER PUBLICATIONS

Etched Schottky Barrier MOSFETS Using a Single Mask, Hobeboom & Cobbold, Electronic Letters, vol. 7, No. 5/6 Mar. 1971.

SB-IGFET: An Insulated Gate Field Effect Transistor Using Schottky Barrier Contacts for Source and Drain, Lepselter & Sultanov. IEEE, Aug. 1968.

Formation kinetics of $CrSi_2$ Films on Si substrates with and without interposed $Pd_2Si$ layer, Olowolafe, J. App. Phys. vol. 47, No. 12, 1976.

Some Properties of Chromium Doped Silicon, Lebedev & Sultanov. Soviet Physics, vol. 4, No. 11, May 1971.

Compound Formation Between Amorphous Silicon & Chromium, Yacobie et al., J. App. Phys. 51(12) Dec. 1980.

Metalurgical & Electrical Properties of Chromium Silicon Interfaces, Martinez et al. Solid State Physics, vol. 23.

The Metal–Semiconductor Contact: Anacid Device With a new Future, Yu, IEEE Spectrum, Mar. 1970.

*Primary Examiner*—Steven H. Loke
*Attorney, Agent, or Firm*—James D. Welch

[57] ABSTRACT

Disclosed are semiconductor systems, such as integrated circuits utilizing Schotky barrier and/or diffused junction technology, which semiconductor systems incorporate material(s) that form rectifying junctions in both metallurgically and/or field induced N and P-type doping regions, and methods of their use. Disclosed are Schottky barrier based inverting and non-inverting gate voltage channel induced semiconductor single devices with operating characteristics similar to multiple device CMOS systems and which can be operated as modulators, N and P-channel MOSFETS and CMOS formed therefrom, and (MOS) gate voltage controlled rectification direction and gate voltage controlled switching devices, and use of such material(s) to block parasitic current flow pathways. Simple demonstrative five mask fabrication procedures for inverting and non-inverting gate voltage channel induced semiconductor single devices with operating characteristics similar to multiple device CMOS systems are also presented.

2 Claims, 5 Drawing Sheets

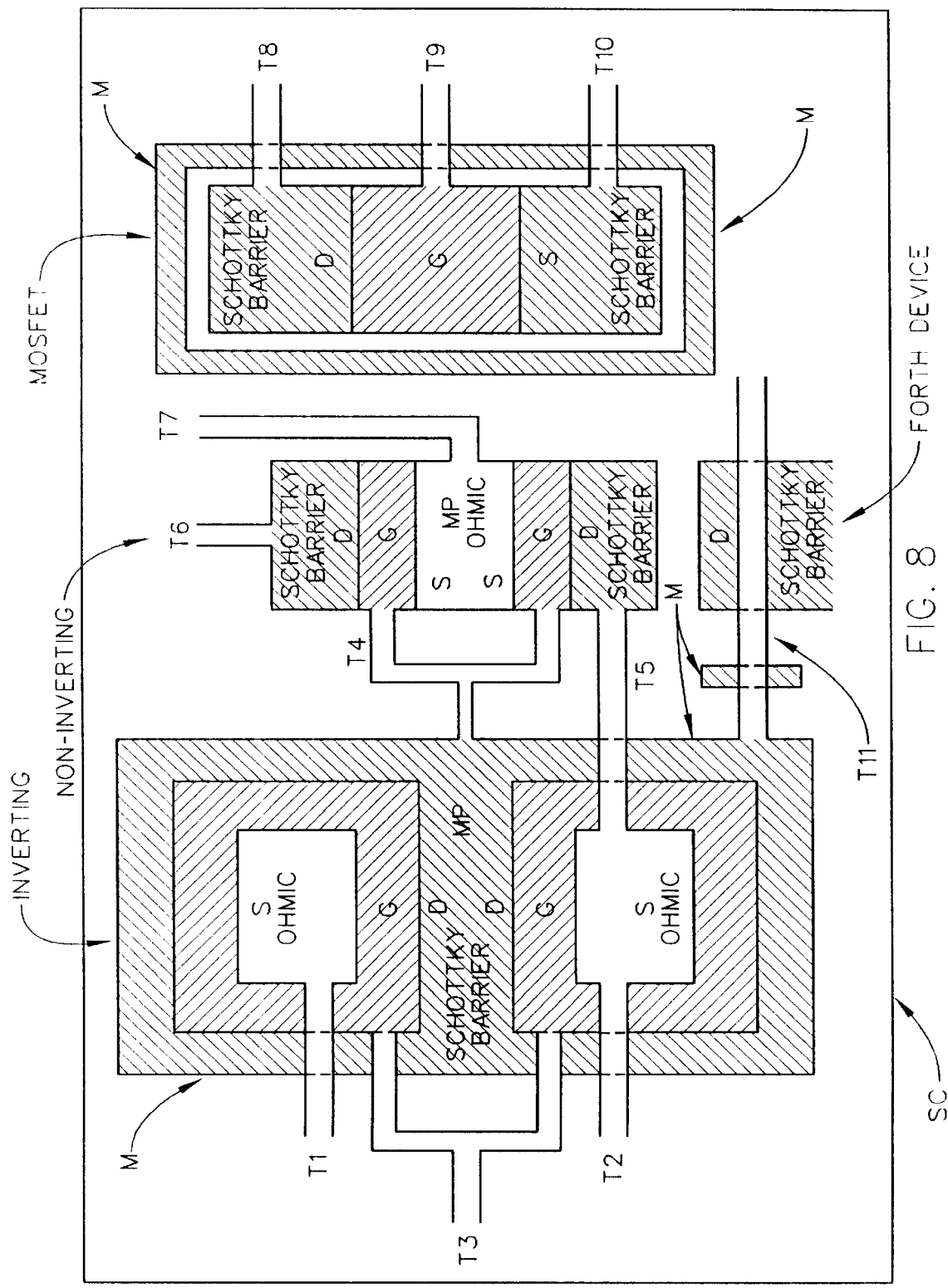

SEMICONDUCTOR SYSTEMS UTILIZING MATERIALS THAT FORM RECTIFYING JUNCTIONS IN BOTH N AND P-TYPE DOPING REGIONS, WHETHER METALLURGICALLY OR FIELD INDUCED, AND METHODS OF USE

This Application is a Continuation-In-Part of application Ser. No. 08/250,906 filed on May 31, 1994, (now abandoned), which is a Continuation-In-Part of application Ser. No. 08/368,149 filed Dec. 29, 1994, (now U.S. Pat. No. 5,663,584), which is a Continuation-In-Part of application Ser. No. 08/578,336 filed Dec. 26, 1995, now U.S. Pat. No. 5,760,449. This Application is a Continuation-In-Part of provisional Application Ser. No. 60/059,270 filed on Sep. 18, 1997. This Application also relies on Disclosure Document No. 402672, filed Jul. 18, 1996.

The invention in this application was developed in part under support provided by a grant from the Energy Related Inventions Program of the United States Federal Department of Energy, Contract No. DE-FG47-93R701314. The United States Government has certain rights in this invention.

TECHNICAL AREA

The present invention relates to semiconductor systems, such as integrated circuits. More particularly the present invention is found in the placing of, and presence of, a material which forms rectifying junctions with both N and P-type semiconductor, whether doping is metallurgically or field induced. Particularly relevant application of the present invention is in integrated circuits comprising Schottky barrier based MOSFETS, CMOS, gate voltage controled direction of rectification, and single device inverting and single device non-inverting gate voltage channel induced semiconductor devices which demonstrate operating characteristics similar to those of multiple device Complimentary Metal Oxide Semiconductor (CMOS) systems, and in semiconductor systems wherein it is desired to block parasitic current flow(s).

BACKGROUND

Schottky barrier based MOSFETS, CMOS, gate voltage controled direction of rectification, and single device inverting and single device non-inverting MOS semiconductor devices which demonstrate operating characteristics similar to those of multiple device Complimentary Metal Oxide Semiconductor (CMOS) systems have been previously described in U.S. Pat. No. 5,663,584. Semiconductor devices described in said 584 patent operate on the basis that materials exist which produce a rectifying junction with semiconductor channel regions when they are doped either N or P-type, whether said doping is achieved via metallurgical or field induced means. Presently disclosed semiconductor devices also have a similar basis of operation.

Continuing, particularly in Metal Oxide Semiconductor Field Effect Transistors Systems, (MOSFETS), (but not limited thereto), the avoidance of unintended parasitic current flow pathways is of great concern during design, testing and application. (MOSFETS), it is noted, operate by effectively inverting doping type in a "Channel" region beneath a Gate by application of a voltage to said Gate. The Channel region is typically, in use, modulated to a very conductive state so that it can carry current. It also occurs, however, that interconnection traces between intended devices, can act as unintended "Effective Gates" and cause current carrying, parasitic, inverted doping type conducting "Channel" regions between unintended points in a semiconductor system. Such unintended current flow pathways can completely disrupt intended semiconductor circuit operation. A system and method which would allow easy and convenient blocking of such unintended current flow pathways would therefore be of utility.

Further relevant background is found in the cited U.S. Pat. No. 5,663,584 to Welch, said patent being incorporated by reference hereinto along with co-pending patent application Ser. No. 08/578,336. Said 584 patent identifies patents to Lepselter, U.S. Pat. No. 4,300,152; Koeneke et al., U.S. Pat. No. 4,485,550; Welch, U.S. Pat. No. 4,696,093; Mihara et al., U.S. Pat. No. 5,049,953 and Homna et al. U.S. Pat. No. 5,177,568. It is noted that the 152 patent points out that SCR-type latchup is avoided where a MOSFET in a CMOS pair is a Schottky barrier based device. A relevant article titled "SB-IGFET: An Insulated Gate Field Effect Transistor using Schottky Barrier Contacts for Source and Drain", by Lepselter & Sze, Proc IEEE, 56, January 1968, pp. 1400–1402, is also identified in said 584 patent. Also mentioned, and included herein by reference for general insight to semiconductor circuits and systems, is a book titled "Microelectronic Circuits" by Sedra and Smith, Saunders College Publishing, 1991.

In view of the fact that the semiconductor industry market has shown strong continuous growth and grew to approximately one-hundred-thirty-nine billion dollars in 1996, and in view of the fact that continued growth relies on new innovation and implementation of semiconductor systems which demonstrate improvement in packing density, ease of fabrication and operational performance, there remains need for new semiconductor system technology. In that light, the present invention presents innovation in the use of materials which produce rectifying junctions in semiconductor which is doped either N or P-type.

DISCLOSURE OF THE INVENTION

To begin, it should be understood that semiconductor systems, (eg. integrated circuits), of even a low degree of complexity comprise many points therein between which current flow must be prevented. Typical practice in (MOS) diffused junction based semiconductor systems is to heavily dope semiconductor in pathways between points therein between which points current flow is to be prevented, so that said heavily doped regions can not be easily inverted by device interconnections which act as unintended Gates. One aspect of the present invention, however, provides that said semiconductor systems be caused to include a "Material" present between such points. In the presence of said "Material", during use, the appearance of a voltage between said circuit points is caused to encounter a reverse biased rectifying junction in a pathway in which current flow could otherwise occur, and this is the case whether said pathway is in a semiconductor region of a metallurgical or of a field induced inverted doping type, where said material is chosen so as to form a rectifying junction with either N or P-type semiconductor. As will be better appreciated by reference to the Drawings and discussion thereof in the Detailed Description Section of this Disclosure, this is the case as a region of such material in a potential current flow pathway forms effective "oppositely facing" diodes on edges of such a region of said material, where said material meets said semiconductor. Where the semiconductor system is silicon, a material which provides the identified properties is Chromium Discilicide. Generally, material which forms a rectifying junction with both N and P-type semiconductor can be selected from the group consisting of: (chromium, molybdinum, tungstun, vanadium, titanium, platinum and a silicide of any thereof). A typical application of the present invention is where said semiconductor system comprises an unintended current flow pathway beneath an interconnection trace, which interconnection trace acts as an unintended Gate in use and effects an inverted semiconductor effective "Channel" region therebeneath.

A present invention method of preventing current flow between at least two points in a semiconductor system comprises the step of, during fabrication of said semiconductor system, causing a material which forms rectifying junctions with both N and P-type semiconductor to be present in a potential unintended current flow path, such that during use, the appearance of a voltage between said at least two points between which current flow is to be prevented is caused to have a reverse biased rectifying junction present in the pathway in which current flow is to be prevented and in which current flow could otherwise occur. The present invention Method can include, in the case where a Schottky barrier junction is present at a Source or Drain regions in a (MOSFET), the photolithographic opening of regions to Material deposition onto the semiconductor involved, in regions where parasitic current flow is to be blocked, as well as photolithographic opening of said Source and/or Drain region(s), followed by Source and/or Drain and Current Path Blocking Schottky barrier forming material deposition. Intended devices which are to be isolated from unintended current flows can be completely surrounded with a continuous "ring" of such material. Said method step is relatively easy to practice and requires but little modification to photolithographic masking utilized in opening said Source and/or Drain.

It is noted that placement of a material which forms a rectifying junction with only present metallurgical doping type, (eg. N or P-type), in a parasitic pathway, can be sufficient to provide a reverse biased junction in said parasitic pathway in which current flow is to be prevented. However, where inversion of a semiconductor effective "Channel" region is a potential concern, such as beneath interconnection traces, the present invention teaches that use of a material which forms rectifying junctions with both N and P-type semiconductor, whether metalurigically or field induced, is preferable. That is, many materials form rectifying junctions with a semiconductor of one type doping, (N or P-type), but essentially ohmic junctions with semiconductor of an opposite type doping (P or N-type respectively). Such materials are suitable for blocking current flow in parasitic pathways where semiconductor doping type is not subject to field induced inversion only, and, while have limited application, are not preferred in the present invention. The Welch, U.S. Pat. No. 5,663,584 identified in the Background Section provides non-limiting insight to fabrication steps for a Schottky barrier based, inverting single device equivalent to Complimentary Metal Oxide Semiconductor System in which isolation of Source and Drain regions is achieved utilizing the underlying principal of the present invention.

Particularly relevant application of the present invention is found in Schottky barrier based semiconductor systems comprising inverting and/or non-inverting gate voltage channel induced semiconductor devices, (similar in Important respects to Metal Oxide Semiconductor (MOS) devices), which each present with operating characteristics similar to multiple device Complimentary Metal Oxide Semiconductor (CMOS) systems. This is the case as conventional heavy semiconductor doping, parasitic current blocking, techniques can not be easily utilized. This is because heavily doped semiconductor forms an essentially ohmic junction with materials that form rectifying Schottky barrier junctions with less heavily doped semiconductor. To provide additional insight, and convenient reference, demonstrative present invention inverting and noninverting single devices which also utilize material which forms rectifying junctions with either N or P-type semiconductor and provide operating characteritics similar to conventional multiple device (CMOS), are described directly.

An inverting gate voltage channel induced semiconductor device with operating characteristics similar to multiple device Complimentary Metal Oxide Semiconductor (CMOS) systems is formed in a surface region of a single doping type semiconductor and comprises two junctions, termed source and drain, which are separated by a first semiconductor channel region, and further comprises two additional junctions, termed source and drain, which are separated by a second semiconductor channel region. Gates, to which semiconductor channel region effecting voltage can be applied, are associated with each of the first and second semiconductor channel regions, said gates being offset from said first and second semiconductor channel regions by insulating material. During use, application a sufficient positive voltage to said gates will attract electrons to said first and second semiconductor channel regions, and application of sufficient negative voltage to said gates will attract holes to both of said first and second semiconductor channel regions, the purpose of applying such gate voltage being to modulate the effective doping type of said first and second semiconductor channel regions between respective source and drain junctions, which source junctions are each essentially non-rectifying, and which drain junctions are rectifying Schottky barrier junctions, said rectifying Schottky barrier junctions each comprising a semiconductor and non-semiconductor component. Continuing, a non-semiconductor component of the rectifying Schottky barrier drain junction associated with said first semiconductor channel region is electrically interconnected with a non-semiconductor component of the rectifying Schottky barrier drain junction associated with said second semiconductor channel region, and said gates associated with the first and second channel regions are electrically interconnected, such that during operation electrically noninterconncted essentially non-rectifying source junctions are held at different voltages, and application of a gate voltage controls effective semiconductor channel region doping type in both said first and second channel regions, and thus which electrically interconnected rectifying Schottky barrier drain junction forward conducts and which does not forward conduct, thereby controlling the voltage present at the non-semiconductor components of the electrically interconnected Schottky barrier drain junctions essentially through said forward conducting rectifying semiconductor Schottky barrier junction. In said inverting gate voltage channel induced semiconductor device an increase in applied Gate voltage leads to a decrease in the voltage present at the non-semiconductor components of the electrically interconnected Schottky barrier drain junctions. It is to be noted that said non-semiconductor components of said Schottky barrier drain junctions are present "between" said first and second channel regions, as said term "between" is utilized herein.

A non-inverting gate voltage channel induced semiconductor device with operating characteristics similar to multiple device Complimentary Metal Oxide Semiconductor (CMOS) systems is formed in a surface region of a single doping type semiconductor and comprises two junctions, termed source and drain, which are separated by a first semiconductor channel region, and further comprises two additional junctions, termed source and drain, which are separated by a second semiconductor channel region. Gates to which semiconductor channel region effecting voltage can be applied are associated with each of the first and second semiconductor channel regions, said gates being offset from said first and second semiconductor channel regions by insulating material. During use, application a sufficient positive voltage to said gates will attract electrons to said first and second semiconductor channel regions, and application of sufficient negative voltage to said gates will attract holes to both of said first and second semiconductor channel regions, the purpose of applying such gate voltage being to modulate the effective doping type of said first and second semiconductor channel regions between respective source and drain junctions, which source junctions are each essentially non-rectifying, and which drain junctions are rectifying Schottky barrier junctions, said rectifying Schottky barrier junctions each comprising a semiconductor and non-semiconductor component. Continuing, in the non-inverting gate voltage channel induced semiconductor device the non-rectifying source junction associated with said first channel region and the non-rectifying source junction associated with the second channel region are electrically interconnected, and said gates associated with the first and second channel regions are electrically interconnected. During operation non-semiconductor components of electrically non-interconncted rectifying Schottky barrier drain junctions are held at different voltages, and application of a gate voltage controls effective semiconductor channel region doping type in both said first and second channel regions, and thus which electrically non-interconnected rectifying Schottky barrier drain junction forward conducts and which does not forward conduct, thereby controlling the voltage present at the electrically interconnected essentially non-rectifying source junctions through said forward conducting rectifying Schottky barrier junction. In said non-inverting gate voltage channel induced semiconductor device an increase in applied Gate voltage leads to an increase in the voltage appearing at the electrically interconnected essentially non-rectifying source junctions. It is to be noted that said essentially non-rectifying source junctions are present "between" said first and second channel regions, as said term "between" is utilized herein.

The basis of operation of both said inverting and non-inverting gate voltage channel induced semiconductor devices is that said Schottky barrier junctions are formed from said first and second semiconductor channel regions and a material which provides a rectifying junction to a semiconductor channel region when it is doped either N or P-type, whether said doping is achieved via metalurigical or field induced means.

In both said inverting and non-inverting gate voltage channel induced semiconductor devices the electrically interconnected source, or electrically interconnected drain, junctions comprise an essentially electrically isolated, (from said gates), terminal, and said electrical interconnection between sources, (noninverting case), or drains, (inverting case), can be considered to be electrically interconnected to a separate or essentially integrated thereinto, essentially electrically isolated terminal. In particular said "essentially electrically isolated terminal" can be an integral indistinguishable unit with an electrical interconnection between non-semiconductor components of a Schottky barrier junction which are present outside of, (ie. "between"), first and second channel regions in an inverting single device with operating characteristics similar to multiple device (CMOS) systems, or similarly, with ohmic junctions between first and second channel regions. Such an "essentially electrically isolated terminal" can also be considered to contact said electrically interconnected sources or drains by a "junction" thereto. The concept of an essentially electrically isolated terminal is identified as it provides anology to conventional (CMOS), but as in conventional (CMOS) its descrete presence is not pivotal. Also, it is specifically noted that the word "between" does not imply a physical, geometrical direct placement of a junction or other contact, but rather refers more to an electrical continuity with junction components "outside" of both channel regions per se. For instance, a junction placed to the right or left or top or bottom of first and/or second channel regions which are located vertically one above the other, is still "between" said first and second channel regions, as it is not within said first or second channel regions. Said otherwise, any geometrical location of any channel regions, contact(s) or junction(s) etc., consistent with described functional operation of Schottky barrier based single device equivalents to multiple device (CMOS) is to be considered within the scope of claimed invention, emphasis added.

It is noted that it is also possible to form (MOSFETS) with rectifying Schottky barrier junctions at both Drain and Source, and copending application Ser. No. 08/578,336 describes N and P-Channel Schottky barrier (MOSFETS) which operate with opposite polarities applied to Drain and Gate. The present invention can be practiced in the presence of such devices, which devices can be described as a P(N)-Channel Schottky barrier MOSFET comprising, in a surface region of an N(P)-type Semiconductor, two Schottky barrier junctions, termed Source and Drain. Said Source and Drain Schottky barrier junctions are separated by an N(P)-type Semiconductor Channel region and said P(N)-Channel Schottky barrier MOSFETs has a Gate offset from said N(P)-type Semiconductor Channel Region by a region of insulator material The P(N)-Channel Schottky barrier MOSFET provides significant Drain Current vs. Applied Drain to Source Voltage as a function of Applied Gate Voltage Operating Curves only when the Voltage applied to the Drain is of a Positive (Negative) Polarity, and when the Voltage applied to the Gate is of a Negative (Positive) Polarity so as to induce an inverted P(N)-type Channel Region, both said Applied Drain and Gate Voltages being referenced to the Source as a common terminal.

The present invention can also be practiced with Complementary Metal Oxide Semiconductor (CMOS) Systems which demonstrate regenerative switching in use and which can be formed from an N-Channel Schottky barrier Metal Oxide Semiconductor Field Effect Transistor (MOSFET) in series combination with a P-Channel Schottky barrier MOSFET. The P-Channel Schottky barrier MOSFET comprises a device formed in a surface region of an N-type Semiconductor, with two Schottky barrier junctions, termed Source and Drain separated by an N-type Semiconductor Channel region. The P-Channel Schottky barrier MOSFET has a Gate offset from said N-type Semiconductor Channel Region by a first region of insulator material and said P-Channel Schottky barrier MOSFET provides significant Drain Current vs. Applied Drain to Source Voltage as a function of Applied Gate Voltage Operating Curves only when the Voltage applied to the Drain is of a Positive Polarity, and when the Voltage applied to the Gate is of a Negative Polarity so as to induce an inverted P-type Channel Region, both said Applied Drain and Gate Voltages being referenced to the Source as a common terminal. The N-Channel Schottky barrier MOSFET comprises a device formed in a surface region of a P-type Semiconductor with two Schottky barrier junctions, termed Source and Drain, which Source and Drain are separated by a P-type Semiconductor Channel region. The N-Channel Schottky barrier MOSFET has a Gate offset from said P-type Semiconductor Channel Region by a second region of insulator material and said N-Channel Schottky barrier MOSFET provides significant Drain Current vs. Applied Drain junction to Source Voltage as a function of Applied Gate Voltage Operating Curves only when the Voltage applied to the Drain is of a Negative Polarity, and when the Voltage applied to the Gate is of a Positive Polarity so as to induce an inverted N-type Channel Region, both said Applied Drain and Gate Voltages being referenced to the Source as a common terminal. To form said regeneratively switching (CMOS) the Source of said N-Channel Schottky barrier MOSFET and the Source of said P-Channel Schottky barrier MOSFET are electrically interconnected to one another, and said Gates of said N and P-Channel Schottky Barrier MOSFETS being electrically interconnected to one another. When a Positive Polarity Voltage is applied to the electrically noninterconnected Drain of the P-Channel Schottky barrier MOSFET, said Positive Polarity being with respect to the Voltage applied to the electrically noninterconnected Drain of the N-Channel Schottky barrier MOSFET, and Voltage at the electrically interconnected Gates is set to essentially that applied to the electrically noninterconnected Drain of the N-channel Schottky barrier MOSFET, the voltage at the electrically interconnected Sources of the N and P-Channel Schottky barrier MOSFETS regeneratively switches to essentially that applied to the electrically noninterconnected Drain of the P-Channel Schottky barrier MOSFET. And when the Voltage at the electrically interconnected Gates is set to essentially that applied to the electrically noninterconnected Drain of the P-Channel Schottky barrier MOSFET, the voltage at the electrically interconnected Sources regeneratively switches to essentially that applied to the electrically noninterconnected Drain of the N-Channel Schottky barrier MOSFET.

It is further disclosed that the present invention can be practiced in conjunction with a gate voltage controlled direction of rectification device, or voltage controlled switch with operating characteristics similar to a non-latching Silicon Controlled Rectifier (SCR). The identified system can be made from a method of configuring a gate voltage channel induced semiconductor system which comprises the steps of providing a (MOSFET) with a rectifying Schottky barrier first junction and a non-rectifying second junction in a surface region of a semiconductor, said first and second junctions being separated by a channel region in said semiconductor, where said channel region has an insulator and gate sequentially situated adjacent thereto. Next, application of a constant voltage between said second and first junctions is effected, said voltage being of a polarity such that said rectifying Schottky barrier first junction is reverse biased, but conducts forward biased current if said second to first junction voltage polarity is reversed. This is followed by application of a gate voltage such that the channel region is caused to be inverted, thereby effecting a forward bias between said inverted channel region and said rectifying Schottky barrier first junction, such that forward biased current flows therethrough. Again, the basis of operation is that said Schottky barrier first junction is formed between said semiconductor channel region and a material which provides a rectifying junction to said semiconductor channel region when it is doped either N or P-type, whether metallurgical or field induced.

The present invention can also be practiced in conjunction with a semiconductor rectification device comprising at least one Schottky barrier junction, said at least one Schottky barrier junction being formed from non-semiconductor and semiconductor components, which at least one Schottky barrier junction has as a non-semiconductor component a material which forms a rectifying junction with either N or P-type semiconductor, said semiconductor doping type being metalurgically or field induced.

The present invention can also be practiced in conjunction with a method of controlling a direction of rectification in a semiconductor device comprising the steps of providing a device comprising at least one rectifying Schottky barrier junction, said at least one rectifying Schottky barrier junction being formed from non-semiconductor and semiconductor components, which at least one rectifying Schottky barrier junction has as a non-semiconductor component a material which forms a rectifying junction with either N or P-type semiconductor whether said semiconductor doping type is metallurgically or field induced, said semiconductor metalurgical doping type being selected from the group consisting of: (N-type, P-type and essentially Intrinsic). Applying a voltage across said at least one rectifying Schottky barrier junction device; and controlling the presence and direction of current flow through said Schottky barrier junction by application of a field which controls the effective doping type of said semiconductor. It is also noted that said direction of rectification device is inherrantly present in the region of a gate voltage channel induced semiconductor device between a Schottky barrier source or drain junction and an ohmic junction, (ie. it is one-half of a single device equivalent to CMOS between a source and midpoint or between a drain and a midpoint.

Inverting and non-inverting Schottky barrier based gate voltage channel induced semiconductor devices, (MOSFETS) per se., devices with operating characteristics similar to non-latching Silicon Controlled Rectifiers (SCR's) can be geometrically realized with regions of parasitic current flow preventing material at least partially surrounding source(s) and/or drain(s), or between separate inverting and non-inverting Schottky barrier based gate voltage channel induced semiconductor devices. And, it is noted, said regions of parasitic current flow preventing material can be positioned to block formation of parasitic (SCR's) in conventional diffused junction circuitry, emphasis added.

It is also noted that an inverting gate voltage channel induced semiconductor device can be fabricated by a procedure comprising, in a functional order, the steps of:
a. providing a silicon substrate selected from the group consisting of: (intrinsic and doped);
b. growing a depth of silicon dioxide atop thereof for use as a gate oxide adjacent to a gate voltage field induced channel region;
c. optionally implanting N or P-type channel doping regions;
d. etching two source openings through said silicon dioxide to the silicon using a first mask and photolithography techniques;
e. depositing aluminum atop the silicon dioxide such that it contacts the silicon through the two etched source openings;
f. etching an "8" shaped pattern around the sources through the aluminum and silicon dioxide to the silicon so that one source is present in each of said regions of said "8" shaped pattern using a second mask and photolithography techniques;
g. optionally continuing said etch performed in step f. into said silicon;

h. depositing a material which forms rectifying junctions with either N or P-type silicon when in contact therewith and annealed, and annealing to form rectifying junctions where said deposited material contacts said silicon;

i. by selective acid etching removing unreacted material which was deposited in step h.;

j. delineating the sources from the gates which surround each of said soures and which are surounded by said etched "8" pattern, said gates being the aluminum deposited in step e. and remaining present between each said source and said "8" shaped pattern using a third mask and photolithography techniques;

k. depositing insulator over the entire surface of the structure;

l. etching openings through said insulator to provide access the gates, sources and "8" shaped region using a forth mask and photolithography techniques;

m. depositing aluminum over the entire surface of the deposited insulator;

n. etching said aluminum deposited in step m. to delineat two sources, "8" and gate contact pads using a fifth mask and photolithography techniques; and o. optionally performing a sinter anneal so that aluminum deposited in step m. and delineated into contact pads in step n. makes good electrical contact with regions etched open in step l. to access said gates, sources and said "8" shaped region.

Finally, an non-inverting gate voltage channel induced semiconductor device can be fabricated by a procedure comprising, in a functional order, the steps of:

a. providing a silicon substrate selected from the group consisting of: (intrinsic and doped);

b. growing a depth of silicon dioxide atop thereof for use as a gate oxide adjacent to a gate voltage field induced channel region;

c. optionally implanting N or P-type channel doping regions;

d. etching an "8" shaped pattern through said silicon dioxide to the silicon using a first mask and photolithography techniques;

e. depositing aluminum atop the silicon dioxide such that it contacts the silicon through said etched silicon dioxide;

f. etching open drain regions inside each of said "8" shaped pattern regions etched open in step d. through said aluminum and silicon dioxide to the silicon using a second mask and photolithography techniques;

g. optionally continuing said etch performed in step f. into said silicon;

h. depositing a material which forms rectifying junctions with either N or P-type silicon when in contact therewith and annealed, and annealing to form rectifying junctions where said deposited material contacts said silicon;

i. by selective acid etching removing unreacted material which was deposited in step h.;

j. delineating the gates which surround each of said drains from the surounding etched "8" pattern, said gates being the aluminum deposited in step e. and remaining present between each said drain and said "8" shaped pattern using a third mask and photolithography techniques;

k. depositing insulator over the entire surface of the structure;

l. etching openings through said insulator to provide access said gates, drains and said "8" shaped region using a forth mask and photolithography techniques; m. depositing aluminum over the entire surface of the deposited insulator;

n. etching said aluminum deposited in step m. to delineat two drains, "8" and gate contact pads using a fifth mask and photolithography techniques; and o. optionally performing a sinter anneal so that aluminum deposited in step m. and delineatd into contact pads in step n. makes good electrical contact with regions etched open in step l. to access said gates, drains and said "8" shaped region.

It is to be particularly appreciated that no high cost diffusions are required, and that only five photolithographic masking precedures are required. The optional ion implants, (when performed), serve to provide a channel depth region of doping and effectively form a doped semiconductor on insulator (the insulator being the intrinsic semiconductor region beyond the channel region), system where intrinsic semiconductor is initially present. It is to be understood that intrinsic silicon is prefered, though not limiting, as the beginning semiconductor system for gate voltage channel induced semiconductor devices and that purely field induced doping is sufficient for operability thereof. This points-up another, operational energy conservation, benefit of present invention gate voltage channel induced semiconductor single device equivalent to (CMOS) devices, that being that a condition of curent flow limiting non-conductive intrinsic silicon exists during a gate voltage controlled output voltage switching procedure. This provides is an inherrant improvement over conventional diffused junction (CMOS) switching characteristics wherein some current flow through a single (CMOS) stage occurs at the switching point.

Also, it is noted that copper or other metal can replace aluminum in the recited demonstrative, non-limiting fabrication procedures, and that additional steps can include deposition of materials to help secure deposited metals and formed silicides etc. As well, polysilicon etc. gates can be formed in place of metal gates.

The present invention will be better understood by reference to the Detailed Description Section of this Disclosure, in conjunction with the accompanying Drawings.

SUMMARY OF THE INVENTION

It is a purpose of the present invention to teach the blocking of current flow in unintended pathways in a semiconductor system, by the placement of, and presence of, material in said unintended current flow pathway, which material forms rectifying junctions with either N or P-type semiconductor, whether metalurgically or field induced.

It is another purpose of the present invention to provide examples of application of material which forms rectifying junctions with either N or P-type semiconductor.

It is yet another purpose of the present invention to identify an approach to blocking formation of parasitic SCR's in diffused junction CMOS circuitry systems.

It is another purpose yet of the present invention to describe semiconductor devices, the operational basis of which relies upon the fact that certain materials form rectifying junctions with either N or P-type doped semiconductor, whether metallurigically or field induced, in a manner which compliments the description found in U.S. Pat. No. 5,663,584 to Welch.

It is a further purpose of the present invention to teach blocking of current flow in unintended pathways to semiconductor systems which comprise Schottky barrier based devices such as (MOSFETS), (CMOS), gate voltage controlled direction of ratification, and gate voltage channel induced semiconductor devices which have operating characteristics similar to inverting and noninverting multiple device conventional (CMOS) systems, and to describe said Schottky barrier based devices.

It is a further purpose yet of the present invention to teach simple fabrication procedures for inverting and noninverting gate voltage channel induced semiconductor devices which have operating characteristics similar to inverting and noninverting multiple device conventional (CMOS) systems.

It is yet another purpose of the present invention to make clear that any rectifying or ohmic junction structure geometry, whether present in a region etched into semiconductor or not, and that any gate structure, metal or polysilicon etc. is within the scope of present invention Schottky barrier based devices such as (MOSFETS), (CMOS), gate voltage controlled direction of retification, and gate voltage channel induced semiconductor devices which have operating characteristics similar to inverting and noninverting multiple device conventional (CMOS) systems.

Other purposes will be evident from a reading of the Disclsoure and claims.

BRIEF DESCRIPTION OF THE DRAWINGS

FIGS. 6b–6e show various Schottky barrier and ohmic to semiconductor junction geometries.

FIGS. 7b–7e show various Schottky barrier and ohmic to semiconductor junction geometries.

FIG. 8 shows a top view of a semiconductor system comprising an inverting gate voltage channel induced semiconductor single device equivalent, and non-inverting gate voltage channel induced semiconductor single device equivalent to (CMOS), with parasitic current flow blocking material placed therebetween in positions which might otherwise have current flow therebetween.

DETAILED DESCRIPTION

As the present invention finds important, though not exclusive, usage in (MOSFET) Systems, the following utilizes (MOSFET) Semiconductor Systems as an example to disclosure.

Figure 1:
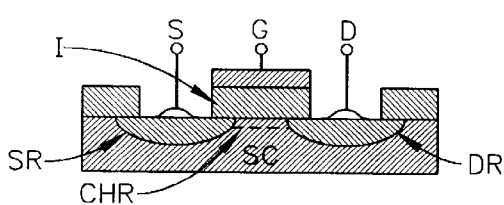
FIG. 1 shows a typical diffused junction (MOSFET) configuration.

Turning now to the Drawings there is shown in FIG. 1, a typical (MOSFET) configuration of a Semiconductor (SC), with an Insulator (I) present atop a surface thereof, atop which Insulator (I), (eg. $SiO_2$ where the semiconductor is silicon), there is present a Gate (G) metal. Also shown, at ends of a Channel Region (CHR) present under said Gate (G), in the Semiconductor (SC), are Source Region (SR) and Drain Region (DR). In conventional Diffused Junction (MOSFETS) the Semiconductor is of a metallurgical doping type (ie. N or P-type), and the Source Region (SR) and Drain Region (DR) are both of the opposite metallurgical doping Type, (ie. P or N-type, respectively). When a voltage is applied between the Gate (G) and the Source Contact (S), and is of a polarity appropriate to invert the Semiconductor metallurgical doping type, then an "inverted" doping type channel appears in the Channel Region (CHR) and current can flow between the Drain Contact (D) and the Source Contact (S). This is as desired. (Note for general purposes that a Negative Polarity Voltage applied Gate to Source will caused accumulation of Holes in a (MOSFET) Channel Region, and that application of a Positive Polarity Voltage Gate to Source will caused accumulation of Electrons in a (MOSFET) Channel Region. Sufficient Positive Polarity Gate to Source Voltage will "Invert" a P-type Channel Region to N-type and sufficient Negative Polarity Gate to Source Voltage will "Invert" an N-type Channel Region to P-type).

Figure 2:
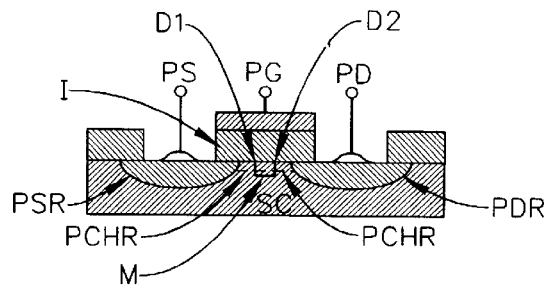
FIG. 2 shows the presence of a material in an otherwise (MOSFET) current pathway.

While geometrically similar to what is shown in FIG. 1, FIG. 2 shows an assumed Parasitic (MOSFET) formed in a Semiconductor (SC) surface region. Shown are said Semiconductor (SC), a Parasitic Gate (PG), Parasitic Source Region (PSR) and Parasitic Drain Region (PDR), Insulator (I), and Parasitic Channel Region (PCHR). Also shown in FIG. 2 is the system of the present invention in the form of additional component Material (M) in the Parasitic Channel Region (PCHR), with associated Rectifying Regions (D1) and (D2) adjacent to left and right sides of said Material (M), in said Parasitic Channel Region (PCHR). It is important to note that said Material (M) forms junctions with the Semiconductor (SC) at two locations, (eg. (D1) and (D2)), and that said junctions are oppositely directed, (see FIGS. 3 and 4). In the preferred embodiment of the present invention said Material (M) forms rectifying junctions at Rectifying Regions (D1) and (D2), where said Semiconductor (SC) is either N or P-type because of either metallurgical or field induced doping in the Parasitic Channel Region (PCHR). It is noted that the Parasitic Gate (PG) can be an interconnection trace in an integrated circuit and that the Parasitic Source Region (PSR) and Parasitic Drain Region (PDR) can be a Source and/or Drain of intended (MOSFET's) in an integrated circuit, such as shown in FIG. 1.

Figure 3:
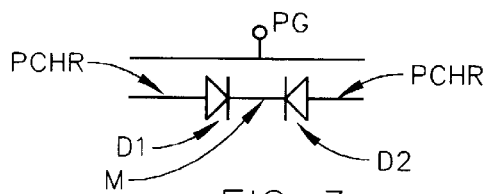
FIG. 3 shows diagramatically the rectification arrangement system of the present invention where metallurgical doping controls.
Figure 4:
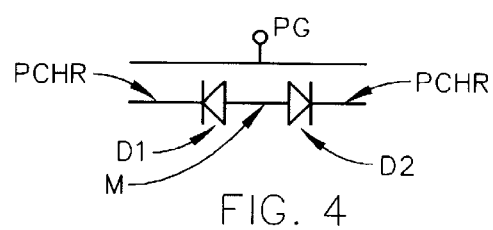
FIG. 4 shows diagramatically the rectification arrangement system of the present invention where field induced inverted doping controls.

FIG. 3 shows that where the Semiconductor (PCHR) of FIG. 2 P-type oppositely facing rectifying junctions in Rectifying Regions (D1) and (D2) have negative or cathode interconnection, and FIG. 4 shows that where the Semiconductor of FIG. 2 is N-type, oppositely facing rectifying junctions in Rectifying Regions (D1) and (D2) have positive or anode interconnection. The point being that where Material (M) is able to form a rectifying junction with either N or P-type Semiconductor, a current flow in the Parasitic Channel Region (PCHR) of FIG. 2 can not occur because regardless of the Polarity of a current flow driving voltage present between Parasitic Drain (PD) and Parasitic Source (PS), a Reverse Biased diode will appear in said Parasitic Channel Region (PCHR) at one or the other of Rectifying Regions (D1) and (D2). The preferred embodiment of the present invention system should now be appreciated.

The method of the present invention involves designing masking and fabrication procedures, and carrying out steps of fabrication, such that the Material (M) shown in the FIG. 2 Parasitic Channel Region (PCHR) is present in regions in, for instance, integrated circuits, wherein potential parasitic current flows can occur but are undesirable.

Figure 5:
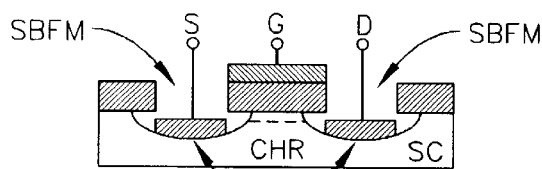
FIG. 5 shows a Schottky barrier (MOSFET) configuration.
Figures 6A, 7A:
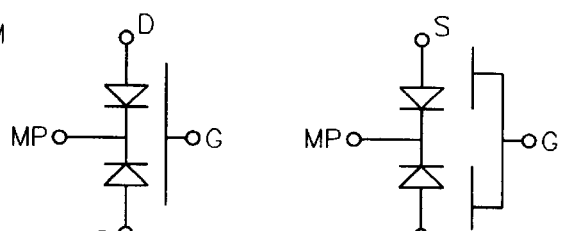
FIGS. 6a and 6b show a circuit symbol and side cross-sectional of a non-inverting gate voltage channel induced semiconductor single device equivalent to (CMOS).
FIGS. 7a and 7b show a circuit symbol and side cross-sectional of an inverting gate voltage channel induced semiconductor single device equivalent to (CMOS).
Figure 6B:
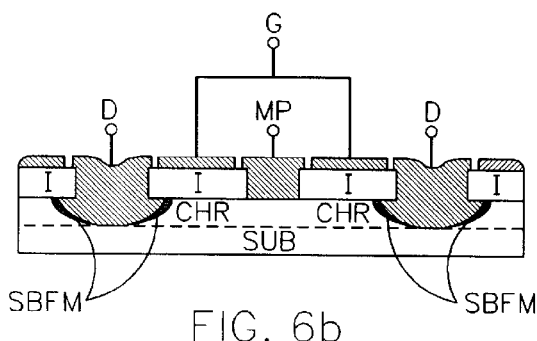
Figure 7B:
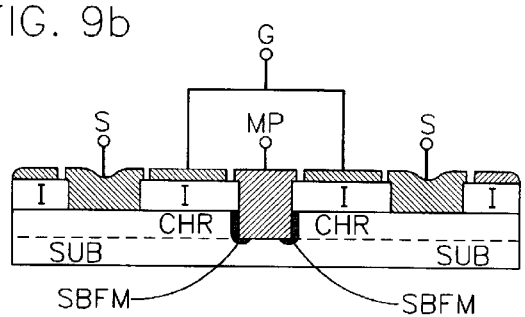
Figure 7C:
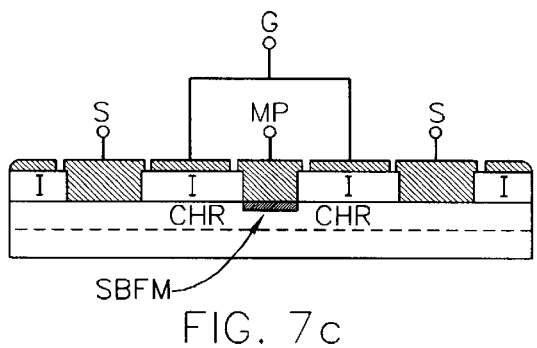
Figure 7D:
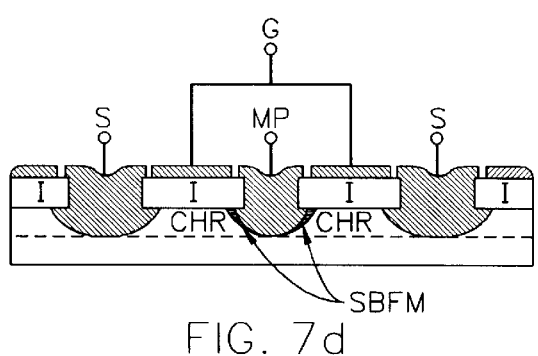
Figure 7E:
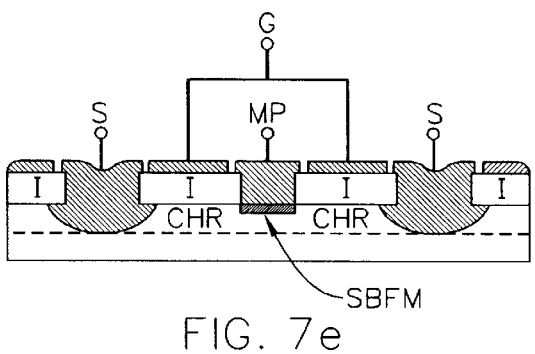

The present invention finds relevant, though not exclusive application in (MOS) systems, (eg. FIG. 1), prticularly where Schottky barriers are utilized at Source (S) and Drain (D) of (MOSFETS) (eg. FIG. 5), and wherein device isolation can be problematic. Note, U.S. Pat. No. 5,663,584 to Welch describes (MOSFET) systems, (including single device equivalents to (CMOS)), which utilize Schottky barrier junctions comprised of semiconductor and a material which forms rectifying junctions with either N or P-type semiconductor material. Said 584 patent is incorporated by reference herein and it is noted, documentes conception of the principal behind the present invention, although parasitic curent flow blocking ws not claimed therein. It is noted, however, that the 584 patent did disclose isolation of Drain current flow in inverting single device equivalents to CMOS, particularly as regards FIG. 10q thereof, the essence of which is repeated in FIG. 8 herein. (FIG. 8 shows that device isolation can be effected by material as described). FIG. 5 herein is included to provide general non-limiting, (other possible junction geometries are as shown in FIGS. 6b–6e and 7b–7e), insight to a Schottky barrier (MOSFET) geometry configuration. The major distinction of Schottky barrier (MOSFETS) is that the Source and Drain regions comprise Schottky barrier forming material (SBFM). FIGS. 6b and 7b show, respectively, non-limiting representations of non-inverting and inverting gate voltage channel induced semiconductor single device equivalents to (CMOS), which are desribed in detail in the 584 patent. The FIG. 6b and 7b devices are shown as fabricated upon an insulating substrate (SUB), (which can comprise intrinsic semiconductor), and it is noted that the identifer "MP" indicates an electrically isolated Midpoint terminal similar to a midpoint of a conventional (CMOS) system.

Figure 6C:
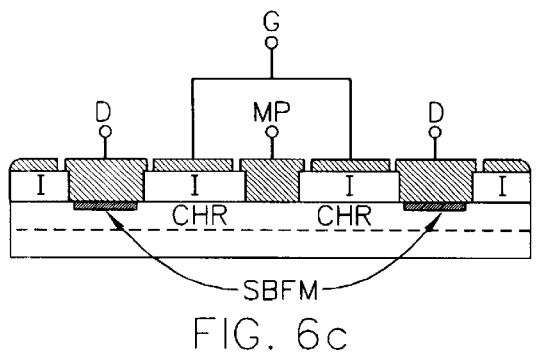
Figure 6D:
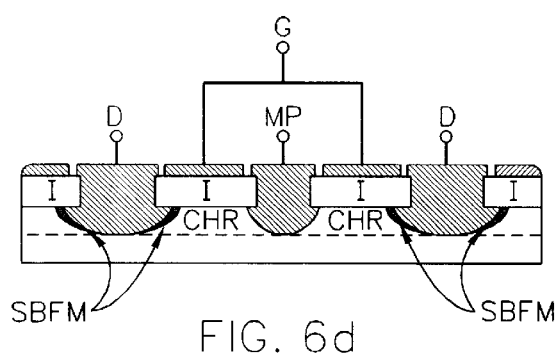
Figure 6E:
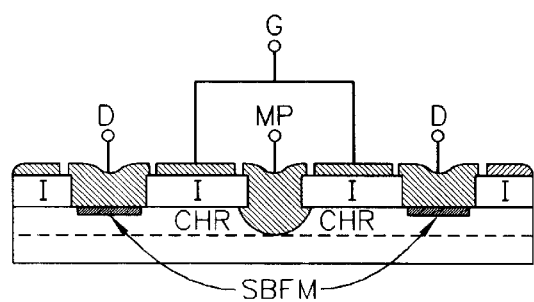
Figure 6F:
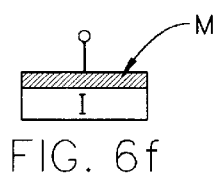
FIGS. 6f and 6g shows two possible gate structures.
Figure 7F:
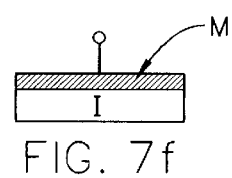
FIGS. 7f and 7g shows two possible gate structures.
Figure 6G:
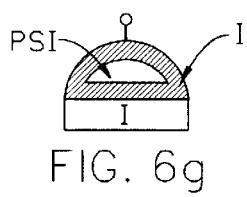
Figure 7G:
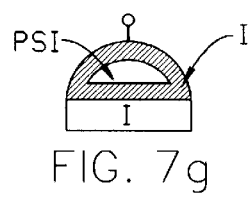

The identifier (CHR) identifies Channel Region(s), (possibly extended (SUB) intrinsic semiconductor with field induced doping present). Note Schottky barrier junctions in FIGS. 6b and 7b are shown as present in etched semiconductor regions. Again, the shown junctions geometry is not limiting and all junctions, both Schottky barrier and ohmic can be formed in etched semiconductor regions, or only the ohmic or rectifying junctions might be present in etched semiconductor regions. A purpose of using etched semiconductor regions is to place junctions under a Gate to avoid reduced gate voltage control over channel end field induced doping, and accompanying current flow limiting high resistance. The Inverting and Noninverting gate voltage channel induced semiconductor single device equivalents to (CMOS) of FIGS. 7b and 6b are better described, in words, in the Disclosure of the Invention Section of this Disclosure. FIGS. 7a and 6a show, respectively, circuit diagrams for inverting and noninverting gate voltage channel induced semiconductor single device eqivalents to multiple device conventional (CMOS), and correspond to the side cross-sections shown in FIGS. 7b and 6b, respectively. FIGS. 6c–6e and 7c–7e show Figures similar to FIGS. 6b and 7b with additional, non-limiting, junction geometries demonstrated, and FIGS. 6g and 7g show non-limiting polysilicon Gate Structure functional equivalents to FIG. 6f and 7f Gates, and are to be considered as interchangably present in FIGS. 6b–6e & 7b–7e. The Gate structure is not determinative of the present invention, but rather the principal of the present invention is that a material be present which forms rectifying junctions with both N and P-type semiconductor whether metalurgically or field induced.

It is noted with reference to the system of FIG. 6b, that if a voltage is applied between the Midpoint (MP) and one of the Drains (D), or with reference to FIG. 7b, if a voltage is applied between the Midpoint (MP) and one of the Sources (S), then application of a channel region effective doping type Gate (G) voltage can control the direction of rectification which said device would demonstrate. That is a gate voltage channel induced semiconductor gate voltage controlled rectification direction device and gate voltage controlled switch with operating characteristics similar to a non-latching Silicon Controlled Rectifier (SCR) is formed. As well, it is noted that if Schottky barrier (MOSFETS) as shown in FIG. 5 are formed on both N and P-type semiconductor, said resulting P-channel and N-channel Schottky barrier (MOSFETS) can be combined into a (CMOS) system by electrical interconnection of non-semiconductor components of Schottky barriers from the two gate voltage channel induced semiconductor devices, and electrical interconnection of the Gates.

FIG. 8 shows a top view of a demonstrative semiconductor system (SC) comprising, sequentially, an Inverting, (see FIGS. 7b–7e for cross-section elevational view), gate voltage channel induced semiconductor single device equivalent, and a Non-inverting, (see FIGS. 6b–6e for cross-section elevational view), gate voltage channel induced semiconductor single device equivalent to (CMOS), and a Schottky barrier (MOSFET). Note that in the Inverting gate voltage channel induced semiconductor single device equivalent to (CMOS) case parasitic current flow blocking material (M) is placed so as to effectively surround ohmic Sources (S), and comprises rectifying Schottky barrier Drain (D) junctions to the semiconductor. Unintended current flow from the Sources (S) of the Non-inverting gate voltage channel induced semiconductor single device equivalent to (CMOS) is thus blocked. It is noted that the encircling Schottky barrier material (M) associated with the (MOSFET) acts as a parasitic current blocking material between Source (S) and Drain (D) therein and Drains and Sources in the Noninverting gate voltage channel induced semiconductor single device equivalent to (CMOS). Note also the demonstrative presence of Traces (T1)–(T10). Traces (T1) and (T2) serve to provide electrical access to electrically noninterconnected Sources (S) of the Inverting gate voltage channel induced semiconductor single device equivalent to (CMOS). Trace (T3) provides electrical interconnection to the Inverting gate voltage channel induced semiconductor device Split Gates (G). Trace (T4) interconnects electrically interconnected Drains (D) of the Inverting gate voltage channel induced semiconductor single device equivalent to (CMOS), (which is analogically similar to an essentially electrically isolated, from the Gate thereof, terminal in a conventional COMS system), to the Split Gates (G) of the Noninverting gate voltage channel induced semiconductor single device equivalent to (CMOS). Trace (T5) provides electrical interconnection of the lower Source (S) of the Inverting gate voltage channel induced semiconductor single device equivalent to (CMOS) to the lower Drain (D) of the Noninverting gate voltage channel induced semiconductor single device equivalent to (CMOS) and Trace (T6) provides access to the upper Drain (D) of the Noninverting gate voltage channel induced semiconductor single device equivalent to (CMOS). Trace (T7) provides output from the electrically interconnected Sources (S) of the Noninverting gate voltage channel induced semiconductor single device equivalent to (CMOS). Taken in combination the electrically interconnected Inverting and Noninverting gate voltage channel induced semiconductor single device equivalents to (CMOS) can be considered an Inverter with an Output Buffer Stage. A voltage input at Trace (T3) will control an inverted signal output at Trace (T7). Also shown is a Schottky barrier (MOSFET) with a surrounding isolating parasitic current blocking material (M). Traces (T8), (T9) and (T10) provide, respectively, electrical access to Drain (D), Gate (G) and Source (S) thereof. Trace (T11) is present to show that "Fan-out" from the Inverting gate voltage channel induced semiconductor single device equivalent to (CMOS) is possible, and the parasitic current blocking material (M) shown thereunder is present to indicate that said Trace (T11) can act as a parasitic MOSFET Gate and can invert semiconductor therebeneath and possibly cause parasitic currents to flow in said inverted semiconductor to a Drain (D) of a partially shown Forth device. Material (M) blocks said current flow as per FIGS. 2, 3 and 4. Trace (T11), (as well as other of the shown Traces), would most likely be present atop a deposited insulator which covers both the Material (M) and the Forth device Drain (D). (Importantly, note that the Forth Device could be a blocked element in an effective parasitic SCR configuration, which U.S. Pat. No. 4,300,152 identifies can be a problem in diffused junction based CMOS. FIG. 9b demonstrates application of the present invention to prevent parasitic four layer PNPN, (or NPNP), SCR-like device formation from PNP and NPN diffused junction transistors. Material "M" blocks parasitic currents.)

Figure 9A:
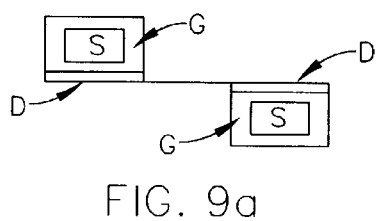
FIG. 9a shows that channel regions in gate voltage channel induced semiconductor single device equivalents to (CMOS) need not be physically aligned, and that electrical interconnection of junctions between channel regions need not be physically geometrically between said channel regions.
Figure 9B:
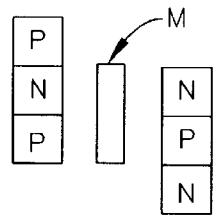
FIG. 9b demonstrates prevention of latch-up in PNPN SCR devices.

FIG. 9a shows that channel regions in gate voltage channel induced semiconductor single device equivalents to (CMOS) need not be physically aligned, and that electrical interconnection of junctions between channel regions need not be physically geometrically between said channel regions. This Figure serves to make clear that electrical contact to an electrical connection between channel regions via a junction can be effected with said junction located anywhere outside both channel regions. A particularly relevant example is where non-semiconductor components of rectifying Schottky barrier junctions to channel regions are electrically interconnected. The non-semiconductor components of the Schottky barrier junctions are interconnected "between" said channel regions, in the relevant electrical sense. While it should go without saying, the word "between" does not in any way imply a requirement of location of a junction or any other equivalent electrical continuity means which is physically, geometrically invariently directly between channel regions.

Figure 10:
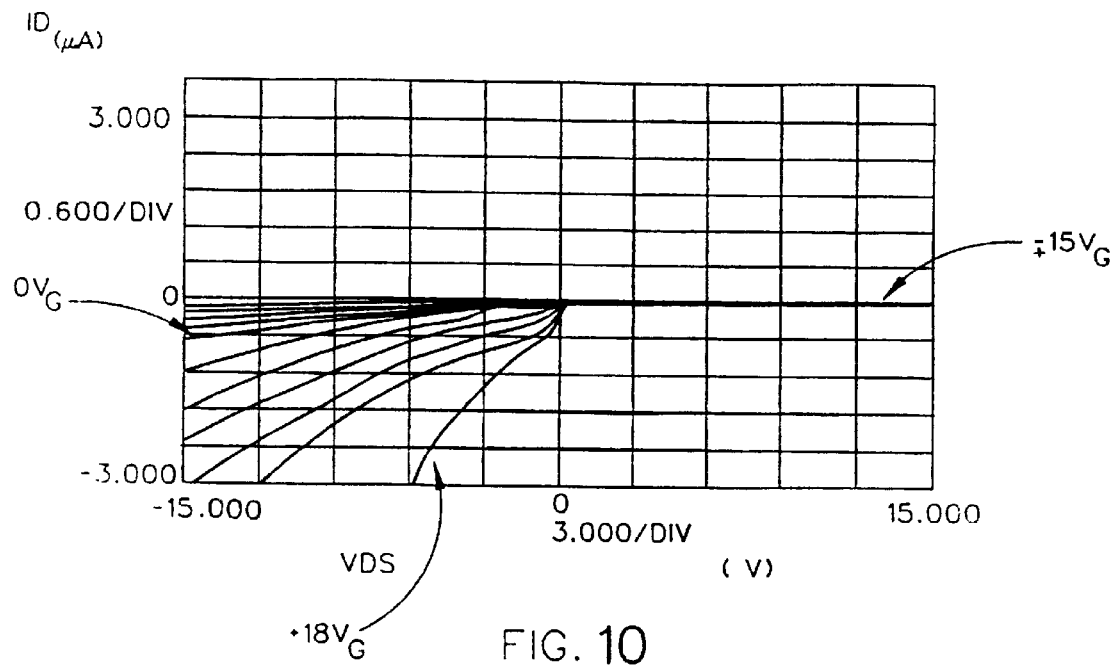
FIGS. 10 and 11 show operational Drain Current (ID) vs. Drain to Source Voltage (VDS), as a function of Gate Voltage (VG) for N-Channel and P-Channel (Schottky barrier MOSFETS) fabricated by the Applicant herein.
Figure 11:
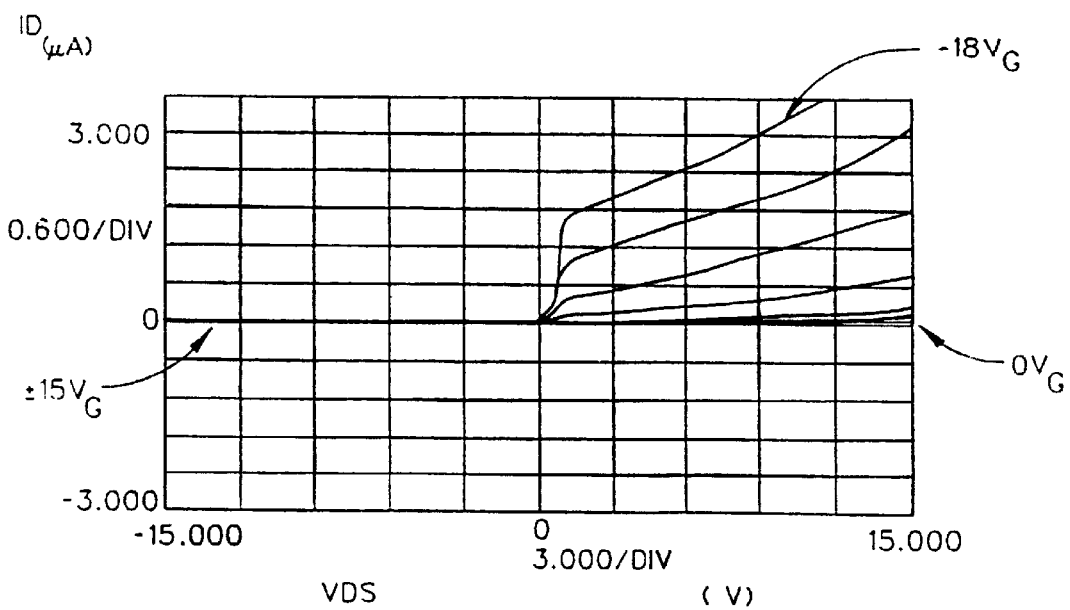
Figure 12A:
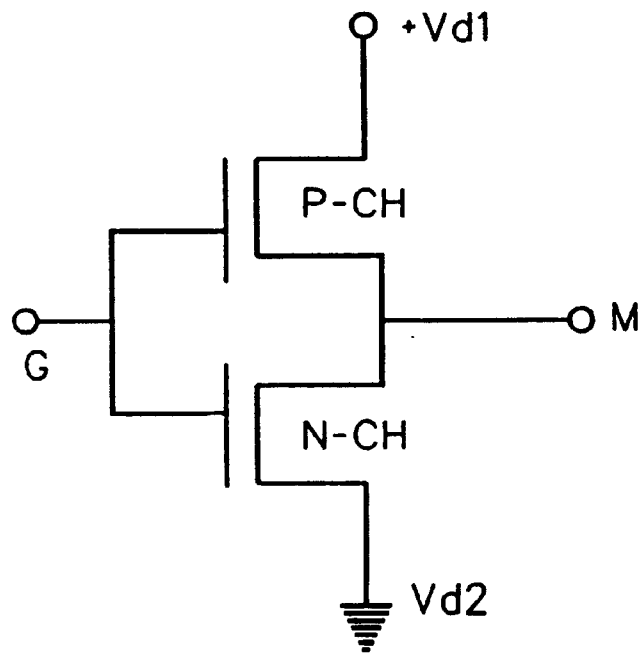
FIGS. 12a and 12b show, respectively, symbols for (CMOS) comprised of N and P-Channel MOSFETS, and a typical (CMOS) switching characteristic curve as a function of Gate Voltage (VG).
Figure 12B:
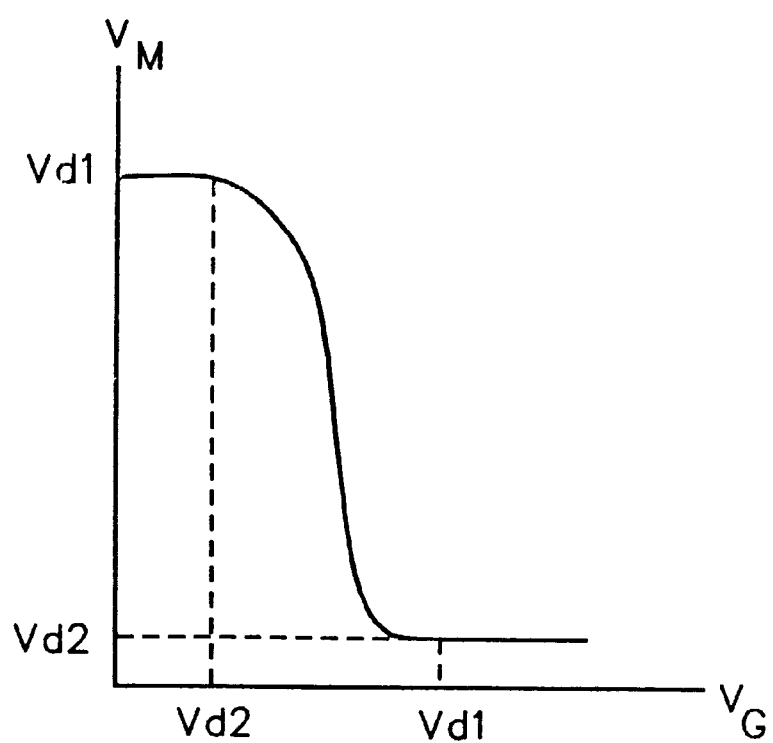

FIGS. 10 and 11 show operational Drain Current (ID) vs. Drain to Source Voltage (VDS), as a function of Gate Voltage (VG) for Schottky barrier (MOSFETS) fabricated by the Applicant herein. FIG. 10 is for an N-Channel and FIG. 11 is for a P-Channel (MOSFET). It is to be noted that the Applied Gate VG) and Drain to Source (VDS) voltages are of opposite polarities. This is in contrast to what is the case in all previously known MOSFETS. FIGS. 12a and 12b show, respectively, symbols for (CMOS) comprised of N and P-Channel MOSFETS, and a typical (CMOS) switching characteristic curve as a function of Gate Voltage (VG).

In the foregoing, as regards the Inverting and Noninverting gate voltage channel induced semiconductor single device equivalents to (CMOS), the rectifying Schottky barrier junctions are identified as Drains, and the essentially non-rectifying junctions are identified as Sources. These terms utilized as they are familiar in (MOS) device settings, but it is to be appreciated that there is no conventional significance to said designation other than to suggest that two (MOSFETS), each formed with one rectifying Schottky barrier junction and one ohmic junction can be combined into Inverting and Noninverting gate voltage channel induced semiconductor single device equivalents to (CMOS) by appropriate interconnection of Rectifying Drains or Ohmic Sources, respectively. Note that gate voltage channel induced semiconductor single device equivalents to (CMOS) shown in FIG. 8 are formed with electrically interconnected integrated Drains (Inverting device) or integrated Sources (Noninverting device). In the context of the Inverting and Non-inverting gate voltage channel induced semiconductor single device equivalents to (CMOS), other terminology could just as well have been utilized, (eg. such as "First" and "Second" junctions for Source/(Drain) and Drain/(Source) respectively). As regards the (MOSFET), however, the use of the terms Source and Drain is more conventional as both Source (S) and Drain (D) junctions are rectifying, and it is to be noted that the semiconductor can be either P or N-type where said Schottky barriers are formed using, for instance, silicon semiconductor and chromium disilicide. As better discussed in U.S. Pat. No. 5,663,584 to Welch, other possible candidates for rectifying Schottky barrier formation with silicon include chromium, molybdenum, tungstun, vanadium, titanium and platinum, and silicides thereof. As well, it is to be understood that any Gate technology (eg. metal, polysilicon etc.), and Insulator type (eg. $SiO_2$ etc.), and depth (eg. 20–3000 Angstroms), and any fabrication procedure which results in claimed systems is to be considered within the scope of the systems claimed.

It is noted that the inverting and noninverting gate voltage channel induced semiconductor single device equivalents to (CMOS) can be utilized as modulators where both applied Gate (G) and Drain or Source voltages are simultaneously varied, and the voltage at the Midpoint (MP) monitored.

Continuing, the terminology "single device equivalents to (CMOS)" is to be understood to mean that each said "single device" is fabricated on a single type doping semiconductor, which can be N-type, P-type or Intrinsic. That is, there is no need to provide alternating N and P-type doped regions wherein P-Channel and N-Channel gate voltage channel induced semiconductor devices, respectively, can be formed. Note that this is not to be taken to mean that various doping type regions such as N-type, P-type and Intrinsic, can not be co-present in a semiconductor substrate in which a present invention "single device equivalent to (CMOS)" is fabricated. In fact it is emphasized that a preferred present invention single device equivalent to CMOS structure utilizes an intrinsic semiconductor substrate with a channel region of a functional depth, (eg. around one-hundred Angstroms or so), present therein just below an insulator-semiconductor interface, (such as is easily achieved by low energy ion-implantation). This is exemplified by FIGS. 6b and 7b where the channel region (CHR) is considered to be N or P-type doping in the surface region of an intrinsic semiconductor substrate (SUB). Also, the terminology "gate voltage channel induced semiconductor device" is typically referred to in industry by the standard terminology "Metal Oxide Semiconductor or (MOS) device". While unlikely that confusion and undue interpretative limitation should develop, the terminology "gate voltage channel induced semiconductor device" has been adopted herein to make clear that the "Gate" can be other than just Metal per se., (eg. the Gate can be polysilicon etc.). That is, in FIGS. 6b and 7b the "G" and "I" combinations are to be broadly interpreted as symbolically including any functional Gate structure, and FIGS. 6a and 7a are to be interpreted as generically symbolically representing the scope of the present invention as regards any Gate structure and rectifying and/or ohmic Junction structure etc. That is, any rectifying or ohmic Source or Drain junction can be present at a surface of a semiconductor, or in a region etched into a semiconductor. Further, where the terminology Metal Oxide Semiconductor Field Effect Transistor (MOSFET) or Metal Oxide Semiconductor (MOS) has been retained in this Disclosure and in the claims, it is to be understood that Gates in described devices can be other than just Metal per se., (eg. polysilicon etc.) and do remain within the scope of said terminology. And, it is to be understood that any means for providing electrical discontinuity between Gate and Source and Drain regions in any device described in this Disclosure is to be considered within the scope of the present invention as claimed. This includes, for instance, use of thick oxide and use of oxide side wall spacers etc. That is, the Doctrine of equivalents is to be considered liberally applicable. The basis of operation of the present invention is that certain materials form rectifying junctions with either N or P-type semiconductor whether said doping is metallurgically or field induced. Other elements and aspects of the present invention are not critical to said basis of operation and therefore are highly open to Doctrine of Equivalents, function maintaining substitution, particulary on an element by element basis. That is, for instance, substitution of a polysilicon or other Gate for a metal Gate does not materially change the present invention, nor does the forming of an ohmic or rectifying junction at a semiconductor surface or in an etched semiconductor region. While said demonstrative variations do provide geometrically different devices, they do not alter the basic underlying principal of operation of the present invention.

It is further noted that FIGS. 6d–6e and 7d–7e show various rectifying and ohmic junctions in isotropically etched semiconductor substrate regions, said semiconductor substrate etched regions are to be interpreted sufficiently broadly so as to include anisotropically etched semiconductor substrate regions as shown in FIG. 7b under the Mid Point (MP), wherein Schottky barrier forming material (SBFM) is accessed via contact metalization. FIGS. 6d–6e and 7d–7e are to demonstrate various etched and non-etched junction geometry locations, and not to exclude other possible junction geometries.

Finally, it is to be understood that while traces T1–T11 as shown in FIG. 8, and metal Gates and (SBFM) contacting metalizations as many Figures represent are typically aluminum, any functional material such as copper, polysilicon (preferably doped to provide high conductivity), and silicides can be used.

Having hereby disclosed the subject matter of the present invention, it should be apparent that many modifications, substitutions, and variations of the present invention are possible in light thereof. It is to be understood that the present invention can be practiced other than as specifically described and should be limited in scope and breadth only by the appended claims.

I claim:

1. A semiconductor system comprising at least one region (s) of parasitic current flow blocking material which forms rectifying junctions with both N and P-type semiconductor, whether said semiconductor type is metallurgically or field induced, in combination with a semiconductor device in a semiconductor substrate, said semiconductor device comprising at least one junction(s) which is formed from material which forms rectifying junctions with both N and P-type semiconductor, whether said semiconductor type is metallurgically or field induced; in which the semiconductor system further comprises at least one additional region(s) of parasitic current flow blocking material in said semiconductor substrate, which is physically separate from the semiconductor device and which prevents significant parasitic currents from flowing therethrough when a voltage is present thereacross; wherein said at least one additional region(s) of parasitic current flow blocking material forms rectifying junctions with both N and P-type semiconductor, whether metallurgically or field induced.

2. A semiconductor system comprising a semiconductor device in a semiconductor substrate, said semiconductor device comprising at least one junction(s) which is formed from non-semiconductor, and semiconductor substrate, components, wherein said non-semiconductor component of said at least one junction(s) is comprised of at least one material(s) which forms rectifying junctions with both N and P-type semiconductor, whether said semiconductor type is metallurgically or field induced; and wherein the semiconductor system further comprises at least one region of parasitic current flow blocking material in said semiconductor substrate, which is physically separate from the semiconductor device and which serves to prevent significant parasitic currents from flowing therethrough when a voltage is present thereacross; wherein said at least one region of parasitic current flow blocking material is comprised of at least one material(s) which forms rectifying junctions with both N and P-type semiconductor, whether metallurgically or field induced.

* * * * *